(12) United States Patent
Yeh

(10) Patent No.: US 10,411,766 B2
(45) Date of Patent: Sep. 10, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventor: Chang-Lin Yeh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 367 days.

(21) Appl. No.: 15/458,742

(22) Filed: Mar. 14, 2017

(65) Prior Publication Data

US 2018/0269708 A1   Sep. 20, 2018

(51) Int. Cl.
| | |
|---|---|
| H04B 5/00 | (2006.01) |
| H01L 23/31 | (2006.01) |
| H01L 23/64 | (2006.01) |
| H01L 23/538 | (2006.01) |
| H01L 23/48 | (2006.01) |
| H01L 21/56 | (2006.01) |
| H01F 27/28 | (2006.01) |
| H01F 38/14 | (2006.01) |
| H01F 5/00 | (2006.01) |
| H01F 27/02 | (2006.01) |
| H01F 27/40 | (2006.01) |
| H02J 50/10 | (2016.01) |
| H01G 4/228 | (2006.01) |

(Continued)

(52) U.S. Cl.
CPC ........... *H04B 5/0062* (2013.01); *H01F 5/003* (2013.01); *H01F 27/022* (2013.01); *H01F 27/2804* (2013.01); *H01F 27/40* (2013.01); *H01F 38/14* (2013.01); *H01L 21/56* (2013.01); *H01L 23/3128* (2013.01); *H01L 23/481* (2013.01); *H01L 23/5381* (2013.01); *H01L 23/5386* (2013.01); *H01L 23/645* (2013.01); *H02J 50/10* (2016.02); *H01G 4/228* (2013.01); *H01G 4/40* (2013.01); *H01L 23/66* (2013.01); *H01L 2224/16225* (2013.01); *H01L 2924/15192* (2013.01); *H01L 2924/15311* (2013.01); *H01L 2924/181* (2013.01); *H01L 2924/19105* (2013.01)

(58) Field of Classification Search
USPC ............................................ 320/108; 307/104
See application file for complete search history.

(56) References Cited

U.S. PATENT DOCUMENTS

| 9,461,001 B1 | 10/2016 | Tsai et al. | |
|---|---|---|---|
| 2009/0168293 A1* | 7/2009 | Kim | H01G 4/30 361/270 |
| 2011/0037322 A1* | 2/2011 | Kanno | H02J 17/00 307/104 |

* cited by examiner

*Primary Examiner* — David V Henze-Gongola
(74) *Attorney, Agent, or Firm* — Foley & Lardner LLP; Cliff Z. Liu

(57) ABSTRACT

A semiconductor device package includes a substrate, a package body, a conductive layer, a dielectric layer, a magnetic layer, a first insulating layer and a coil. The package body is disposed on the substrate. The package body has a first part and a second part disposed above the first part. The conductive layer is disposed on the first part of the package body and is electrically connected to the substrate. The dielectric layer is disposed on the conductive layer. The magnetic layer is disposed on the dielectric layer. The first insulating layer is disposed on the magnetic layer. The coil is disposed on the first insulating layer. The coil has a first terminal electrically connected with the magnetic layer.

23 Claims, 15 Drawing Sheets

(51) Int. Cl.
*H01G 4/40* (2006.01)
*H01L 23/66* (2006.01)

SEMICONDUCTOR PACKAGE DEVICE AND METHOD OF MANUFACTURING THE SAME

BACKGROUND

1. Technical Field

The present disclosure relates to a semiconductor package device and a method of manufacturing the same, and more particularly, to a semiconductor package device including an antenna embedded therein and a method of manufacturing the same.

2. Description of the Related Art

Near Field Communication (NFC) is a short-distance, high-frequency wireless communication technology and includes contact-free radio frequency identification (RFID) and interconnection technologies.

NFC technology can be applied to products such as a credit card, an identification (ID) card, a smart phone or a wireless charger. It can be desirable to improve communication quality and to reduce a total package size of an NFC device.

SUMMARY

In a first aspect, in accordance with some embodiments of the present disclosure, a semiconductor device package includes a substrate, a package body, a conductive layer, a dielectric layer, a magnetic layer, a first insulating layer and a coil. The package body is disposed on the substrate. The package body has a first part and a second part disposed above the first part. The conductive layer is disposed on the first part of the package body and is electrically connected to the substrate. The dielectric layer is disposed on the conductive layer. The magnetic layer is disposed on the dielectric layer. The first insulating layer is disposed on the magnetic layer. The coil is disposed on the first insulating layer. The coil has a first terminal electrically connected with the magnetic layer.

In another aspect, in accordance with some embodiments of the present disclosure, a semiconductor device package includes a substrate, a package body, a first conductive layer, a dielectric layer, a second conductive layer, a magnetic layer and a coil. The package body is disposed on the substrate. The package body has a first part and a second part above the first part. The first conductive layer is disposed on the first part of the package body and is electrically connected to the substrate. The dielectric layer is disposed on the first conductive layer. The second conductive layer is disposed on the dielectric layer. The magnetic layer is disposed over the second conductive layer. The coil is disposed over the magnetic layer. The coil has a first terminal electrically connected with the second conductive layer.

In another aspect, in accordance with some embodiments of the present disclosure, a magnetic resonance wireless charging module includes a substrate, a metal-insulator-metal (MIM) capacitor, a magnetic layer and a coil. The MIM capacitor is disposed over the substrate. The MIM capacitor includes a first terminal electrically connected with the substrate. The magnetic layer is disposed on the MIM capacitor. The coil is disposed over the magnetic layer. The coil has a first terminal electrically connected with a second terminal of the MIM capacitor.

Figure 1:
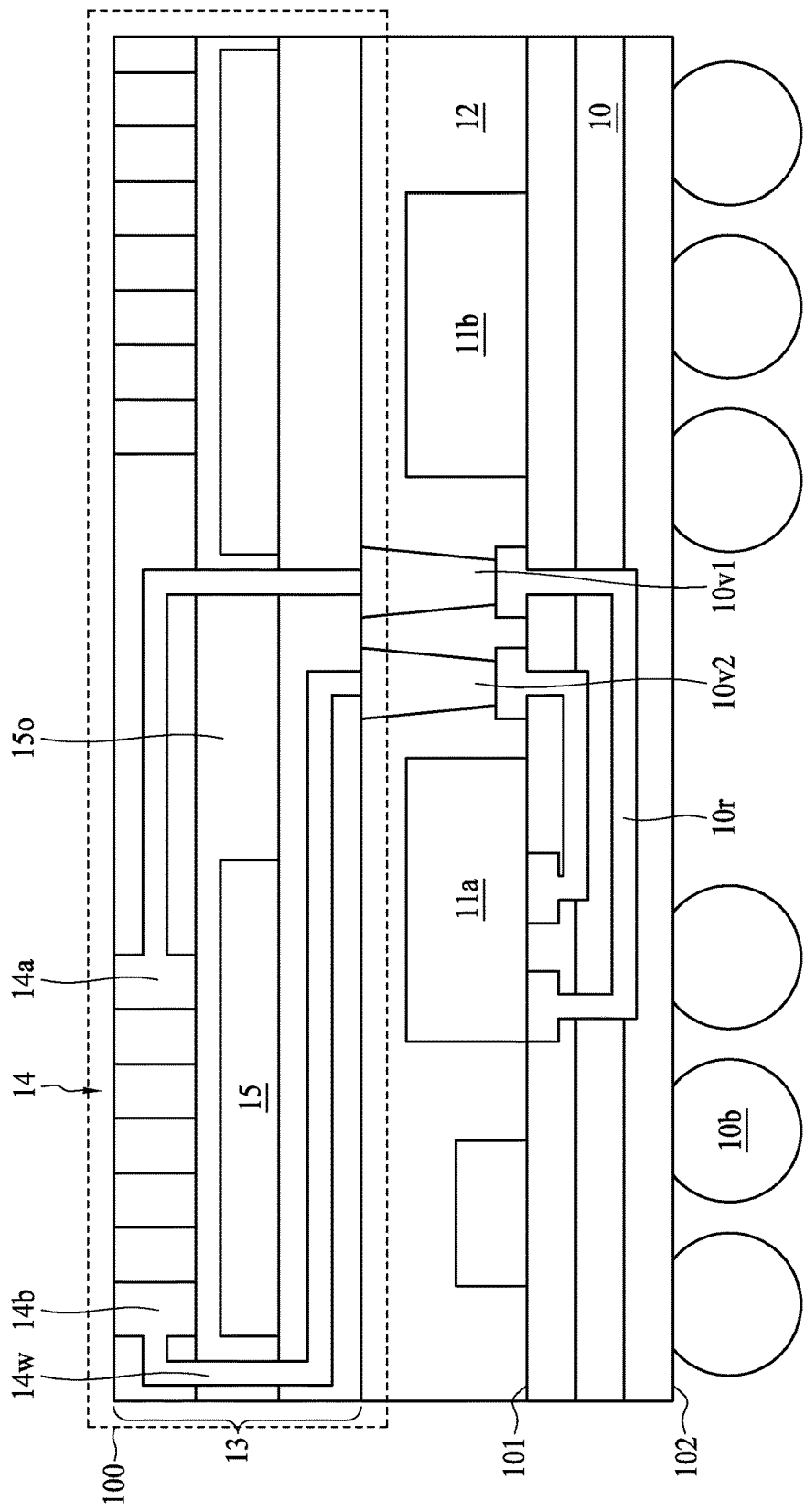
FIG. 1 illustrates a cross-sectional view of a semiconductor package device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

In some embodiments of this disclosure, for example, in some embodiments in which radio frequency identification (RFID) is used for Near Field Communications (NFC), an antenna structure is used for passive RFID, semi-passive RFID, or active RFID, each of which may benefit from improvements in communication quality and increased communication distance. In addition to challenges related to transmission through the antenna structure, passive RFID faces an additional challenge in that power to operate components of a passive RFID device (e.g. logic components) may be received by way of an induced current from an associated antenna structure. Thus, in passive RFID devices, the antenna structure may be used both to receive a power transfer (e.g., the induced current) and to transmit information. Current may be induced in the antenna structure by passing the antenna through a magnetic field, such as a magnetic field generated by an RFID reader. The magnetic field may be strongest closest to the source, and may diminish as a distance from the source increases. An improvement in the reception capability of the antenna structure may allow for an RFID device to receive sufficient power to operate the components of the RFID device at an increased distance from a magnetic field source. Additionally, an improvement in the reception capability of the antenna may also improve the transmission capability of the antenna. Some embodiments of the present disclosure are described as an antenna structure useful for improving a passive RFID device. However, such an antenna structure will also be useful for improving other NFC devices, and indeed, non-NFC devices.

FIG. 1 illustrates a cross-sectional view of a semiconductor package device 1 in accordance with some embodiments of the present disclosure. The semiconductor package device 1 includes a substrate 10, electronic components 11a, 11b, a package body 12 and a coil module 100.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure 10r, such as a redistribution layer (RDL) or a grounding component. In some embodiments, the grounding component is a via exposed from a lateral surface of the substrate 10. In some embodiments, the grounding component is a metal layer exposed from the lateral surface of the substrate 10. In some embodiments, the grounding component is a metal trace exposed from the lateral surface of the substrate 10. In some embodiments, the substrate 10 includes a surface 101 and a surface 102 opposite to the surface 101. The surface 101 of the substrate 10 is referred to as a top surface or a first surface and the surface 102 of the substrate 10 is referred to as a bottom surface or a second surface.

The electronic components 11a, 11b are disposed on the top surface 101 of the substrate 10. The electronic component 11a may include a passive electronic component, such as a capacitor, a resistor or an inductor. The electronic component 11b may include an active electronic component, such as an integrated circuit (IC) chip or a die. Each electronic component 11a, 11b may be respectively electrically connected to one or more other electronic components (e.g., may be connected to each other) and to the substrate 10 (e.g., to the RDL), and electrical connection may be attained by way of flip-chip or wire-bond techniques.

The package body 12 is disposed on the top surface 101 of the substrate 10 and encapsulates the electronic components 11a, 11b. In some embodiments, the package body 12 includes an epoxy resin including fillers dispersed therein.

A plurality of electric contacts 10b are disposed on the bottom surface of the substrate 10 for providing electric connections between the electronic components 11a and 11b and external devices. In some embodiments, the electric contacts 10b are solder balls.

The coil module 100 is disposed on the package body 12. The coil module 100 includes a carrier 13, a coil 14 and a magnetically permeable component 15.

The carrier 13 is disposed on the package body 12. In some embodiments, the carrier 13 is a multi-layer carrier. In some embodiments, the carrier 13 may include a dielectric layer, which may include molding compounds, pre-impregnated composite fibers (e.g., pre-preg), borophosphosilicate glass (BPSG), silicon oxide, silicon nitride, silicon oxynitride, undoped silicate glass (USG), any combination thereof, or the like.

The magnetically permeable component 15 is disposed within the carrier 13 and over the package body 12. In some embodiments, the magnetically permeable component 15 forms a loop and/or is substantially annulus shaped and/or is substantially coil shaped, and defines a space 15o between portions of the magnetically permeable component 15 (which may correspond to, for example, an inner diameter of the magnetically permeable component 15). The magnetically permeable component 15 includes a material with a high magnetic permeability and low magnetic saturation. The magnetically permeable component 15 can include, for example, Ferrite, such as, but not limited to, ferric oxide ($Fe_2O_3$), zinc ferrite ($ZnFe_2O_4$), manganese-zinc ferrite ($Mn_aZn_{(1-a)}Fe_2O_4$) or nickel-zinc ferrite ($Ni_aZn_{(1-a)}Fe_2O_4$), Ferroalloy, such as, but not limited to, ferrosilicon (FeSi), ferro silicon manganese (FeSiMg), iron phosphide (FeP) or iron-nickel (FeNi), magnetic adhesive or other magnetically permeable metal or metal alloy (e.g., another nickel-containing or iron-containing material), or a combination thereof. One measure of magnetic permeability of a material is in terms of its relative permeability with respect to a permeability of free space. Examples of suitable magnetically permeable materials for the magnetically permeable component 15 include those having a relative permeability greater than about 1, such as at least about 2, at least about 5, at least about 10, at least about 50, at least about 100, at least about 500, at least about 1000, at least about 5000, at least about $10^4$, at least about $10^5$, or at least about $10^6$. Magnetic permeability of a material can be measured in standardized conditions, such as at room temperature and at a particular field strength, such as at about 0.5 Tesla or at about 0.002 Tesla. In some embodiments, the permeability of the magnetically permeable component 15 is in a range from about 500 henry per meter (H/m) to about 3000 H/m.

The coil 14 is disposed within the carrier 13 and over the magnetically permeable component 15. In some embodiments, an inner diameter of the coil 14 is greater than an inner diameter of the magnetically permeable component 15 (e.g. the inner diameter of the coil 14 is greater than a width of the opening 15o defined by the magnetically permeable component 15), and an outer diameter of the coil 14 is less than an outer diameter of the magnetically permeable component 15. For example, a projection of the coil 14 on the package body 12 (e.g., a vertical projection extending from the coil 14 to the package body 12) is completely covered by a projection of the magnetically permeable component 15 on the package body 12 (e.g., a vertical projection extending from the magnetically permeable component 15 to the package body 12). For example, as shown in FIG. 1, a total horizontal extension of the magnetically permeable component 15 is greater than a total horizontal extension of the coil 14.

In some embodiments, the coil 14 includes two terminals 14a, 14b. Terminal 14a (which can be also referred to as an "inner terminal") is closer to a center of the coil 14 (e.g. is substantially at or near the center of the coil 14) than is the terminal 14b (which can be also referred to as an "outer terminal"), which is disposed at a peripheral edge of the coil 14. The terminal 14a of the coil 14 electrically connects to an electrical connection 10v1 (e.g., to a through via that traverses the package body 12) through an opening 15o defined by the magnetically permeable component 15. The terminal 14b of the coil 14 electrically connects to an electrical connection 10v2 (e.g., to a through via that traverses the package body 12) by a conductive line 14w passing along an edge (e.g. a lateral edge) of the magnetically permeable component 15 and passing under the magnetically permeable component 15. The coil 14 can be magnetically coupled to a magnetic field to induce a current within the coil 14. In some embodiments, the induced current is provided to the electronic components 11a, 11b through electrical connections 10v1, 10v2 and the interconnection structure 10r within the substrate 10, so as to power the electronic components 11a, 11b or other electronic components external to the semiconductor package device 1. Thus, the coil 14 can function as a wireless receiver (e.g., a charging coil). The coil 14 includes a conductive material such as a metal or metal alloy. Examples include gold (Au), silver (Ag), aluminum (Al), copper (Cu), or an alloy thereof.

In some comparative wireless charging devices, the coil is an individual component separated from other electronic components, which would increase the total size and manufacturing costs of the wireless charging devices. By integrating a wireless charging coil into the semiconductor package device 1 as shown in FIG. 1, the total size and manufacturing costs can be reduced. In addition, since the magnetically permeable component 15 is disposed between the coil 14 and electronic components 11a, 11b, the magnetically permeable component 15 can reduce the likelihood of (e.g., prevent) the electronic components 11a, 11b from being interfered with by undesired magnetic fields passing through the coil 14. The magnetically permeable component 15 is also beneficial for heat dissipation of the semiconductor package device 1.

Figure 2A:
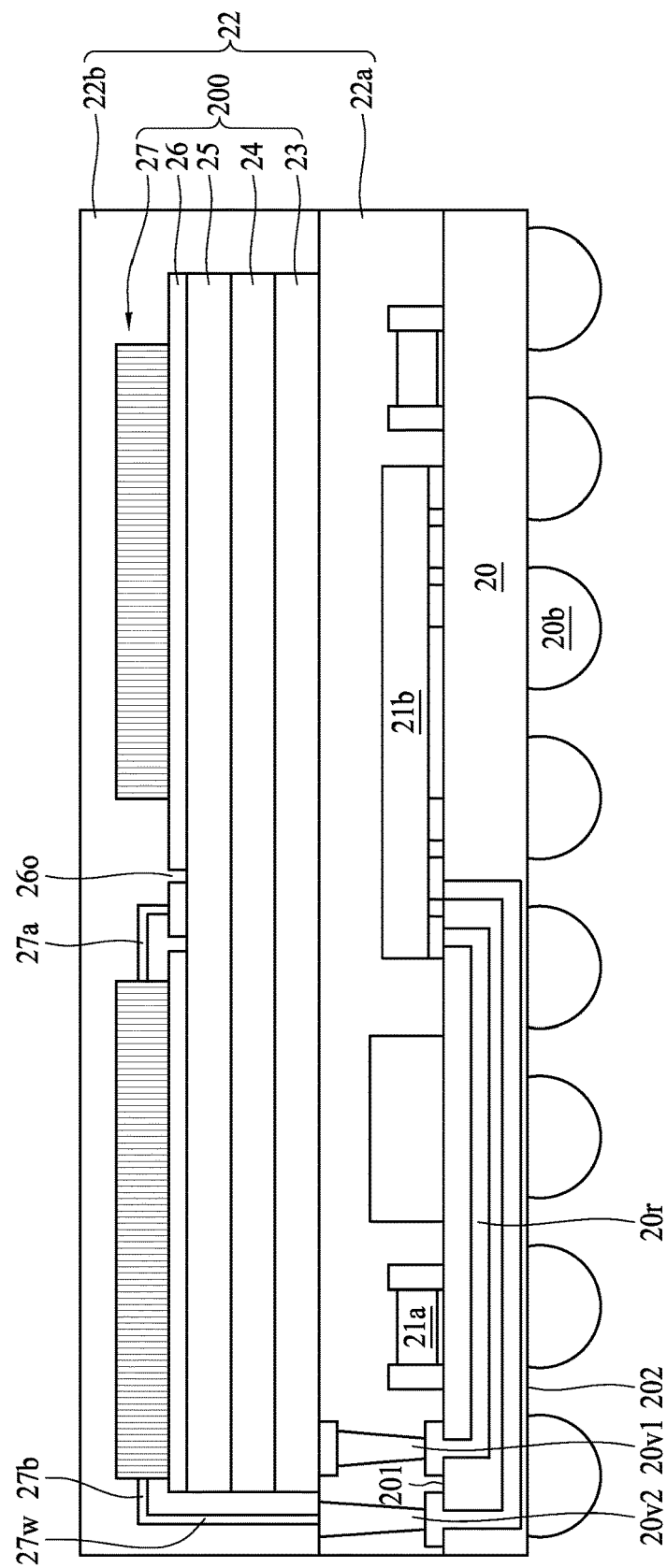
FIG. 2A illustrates a cross-sectional view of a semiconductor package device in accordance with some embodiments of the present disclosure.

FIG. 2A illustrates a cross-sectional view of a semiconductor package device 2A in accordance with some embodiments of the present disclosure. The semiconductor package device 2A includes a substrate 20, electronic components 21a, 21b, a package body 22 and a coil module 200.

The substrate 20 may include, for example, a printed circuit board, such as a paper-based copper foil laminate, a composite copper foil laminate, or a polymer-impregnated glass-fiber-based copper foil laminate. The substrate 20 may include an interconnection structure 20r, such as a RDL or a grounding component. In some embodiments, the grounding component is a via exposed from a lateral surface of the substrate 20. In some embodiments, the grounding component is a metal layer exposed from the lateral surface of the substrate 20. In some embodiments, the grounding component is a metal trace exposed from the lateral surface of the substrate 20. In some embodiments, the substrate 20 includes a surface 201 and a surface 202 opposite to the surface 201. The surface 201 of the substrate 20 is referred to as a top surface or a first surface and the surface 202 of the substrate 20 is referred to as a bottom surface or a second surface. In some embodiments, a holding structure (not shown in FIG. 2A) may be disposed on the top surface 201 of the substrate 20 to separate the coil module 200 from the substrate 20. In some embodiments, the holding structure is a spacer.

The electronic components 21a, 21b are disposed on the top surface 201 of the substrate 20. The electronic component 21a may include a passive electronic component, such as a capacitor, a resistor or an inductor. The electronic component 21b may include an active electronic component, such as an IC chip or a die. Each of the electronic component 21a, 21b may be respectively electrically connected to one or more other electronic component (e.g., may be electrically connected to each other) and to the substrate 20 (e.g., to the RDL), and electrical connection may be attained by way of flip-chip or wire-bond techniques.

The package body 22 may include a first portion 22a and a second portion 22b. The first portion 22a of the package body 22 is disposed on the top surface 201 of the substrate 20 and encapsulates the electronic components 21a, 21b. The second portion 22b of the package body 22 is disposed on the first portion 22a of the package body 22 to encapsulate the coil module 200. In some embodiments, the first portion 22a and the second portion 22b of the package body 22 are formed by a single molding process. Alternatively, the first portion 22a and the second portion 22b of the package body 22 are formed by different molding processes. In some embodiments, the package body 22 includes an epoxy resin including fillers dispersed therein. In some embodiments, the package body 22a includes electrical connections 20v1 and 20v2 (e.g. through vias that traverse the package body 22a).

A plurality of electric contacts 20b are disposed on the bottom surface of the substrate 20 for providing electric connections between the electronic components 21a, 21b and external devices. In some embodiments, the electric contacts 20b are solder balls.

The coil module 200 is disposed on the first portion 22a of the package body 22. The coil module 200 includes a conductive layer 23, a dielectric layer 24, a magnetic layer 25, an insulating layer 26 and a coil 27.

The conductive layer 23 is disposed on the first portion 22a of the package body 22. The conductive layer 23 contacts a portion of the electrical connection 20v1 that is exposed from the first portion 22a of the package body 22. In some embodiment, the conductive layer 23 is a non-magnetic (or weakly magnetic) conductive layer. The conductive layer 23 includes a material with a high conductivity. For example, the conductive layer 23 includes any of Ag, Cu, Al, Au, or an alloy thereof.

The dielectric layer 24 is disposed on the conductive layer 23. The dielectric layer may include molding compounds, pre-impregnated composite fibers (e.g., pre-preg) BPSG, silicon oxide, silicon nitride, silicon oxynitride, USG, any combination thereof, or the like. Examples of molding compounds may include, but are not limited to, an epoxy resin having fillers dispersed therein. Examples of a pre-preg include, but are not limited to, a multi-layer structure formed by stacking or laminating a number of pre-impregnated materials/sheets.

The magnetic layer 25 is disposed on the dielectric layer 24. The magnetic layer 25 includes a material with a high magnetic permeability and low magnetic saturation. The magnetic layer 25 can include, for example, Ferrite, such as, but not limited to, $Fe_2O_3$, zinc ferrite $ZnFe_2O_4$, manganese-zinc ferrite $Mn_aZn_{(1-a)}Fe_2O_4$ or nickel-zinc ferrite $Ni_aZn_{(1-a)}Fe_2O_4$, Ferroalloy, such as, but not limited to, ferrosilicon FeSi, ferro silicon manganese FeSiMg, iron phosphide FeP or iron-nickel FeNi, magnetic adhesive or other magnetically permeable metal or metal alloy (e.g., another nickel-containing or iron-containing material), or a combination thereof. One measure of magnetic permeability of a material is in terms of its relative permeability with respect to a permeability of free space. Examples of suitable magnetically permeable materials for the magnetic layer 25 include those having a relative permeability greater than about 1, such as at least about 2, at least about 5, at least about 10, at least about 50, at least about 100, at least about 500, at least about 1000, at least about 5000, at least about $10^4$, at least about $10^5$, or at least about $10^6$. Magnetic permeability of a material can be measured in standardized conditions, such as at room temperature and at a particular field strength, such as at about 0.5 Tesla or at about 0.002 Tesla. In some embodiments, the permeability of the magnetic layer 25 is in a range from about 500 H/m to about 3000 H/m The insulating layer 26 is disposed on the magnetic layer 25. The insulating layer 26 is insulating, and can be magnetic or non-magnetic. The insulating layer 26 can include, for example, ferromagnetic materials such as barium ferrate or strontium ferrite. The insulating layer 26 can include an oxidized form of metals or non-metals such as silicon dioxide ($SiO_2$) or aluminum oxide ($Al_2O_3$).

The coil 27 is disposed on the insulating layer 26. In some embodiments, an outer diameter of the coil 27 is less than an outer diameter of the magnetic layer 25. For example, a projection of the coil 27 on the first portion 22a of the package body 22 (e.g., a vertical projection extending from the coil 27 to the first portion 22a of the package body 22) is completely covered by a projection of the magnetic layer 25 on the first portion 22a of the package body 22 (e.g., a vertical projection extending from the magnetic layer 25 to the first portion 22a of the package body 22). For example, as shown in FIG. 2A, a total horizontal extension of the magnetic layer 25 is greater than a total horizontal extension of the coil 27.

In some embodiments, the coil 27 includes two terminals 27a, 27b. The terminal 27a (which can be also referred to as the "inner terminal") is closer to a center of the coil 27 (e.g. is substantially at or near the center of the coil 27) than is the terminal 27b (which can be also referred to as the "outer terminal"), which is disposed at a peripheral edge of the coil 27. The terminal 27a of the coil 27 electrically connects to the magnetic layer 25 through an opening 26o defined by the insulating layer 26. In some embodiments, the connection can be achieved by wire bonding or conductive paste techniques. The terminal 27b of the coil 27 electrically connects to the electrical connection 20v2 (e.g., a through via) within the first portion 22a of the package body 22 by a conductive line 27w (or conductive paste) disposed along a peripheral edge of the insulating layer 26, the magnetic layer 25, the dielectric layer 24 and the conductive layer 23. The coil 27 can be magnetically coupled to a magnetic field to induce a current within the coil 27. In the case of using conductive paste to connect the terminal 27b and the electrical connection 20v2, an insulating component (e.g., an underfill) can be disposed between the conductive paste and the magnetic layer 25 and the conductive layer 23. In some embodiments, the induced current is provided to the electronic components 21a, 21b through electrical connections 20v1, 20v2 and the interconnection structure 20r within the substrate 20, so as to power the electronic components 21a, 21b or other electronic components external to the semiconductor package device 2A. Thus, the coil 27 can function as a wireless receiver (e.g., a charging coil). The coil 27 includes a conductive material such as a metal or metal alloy. Examples include Au, Ag, Al, Cu, or an alloy thereof.

In some embodiments, the conductive layer 23, the dielectric layer 24 and the magnetic layer 25 defines a MIM capacitor, in which the magnetic layer 25 is one terminal of the MIM capacitor and the conductive layer 23 is another terminal of the MIM capacitor. The induced current of the coil 27 is transmitted from the magnetic layer 25 to the conductive layer 23 by capacitance coupling. Thus, the coil module 200 of semiconductor package device 2A functions as a magnetic resonance charging module.

The semiconductor package device 2A can offer some advantages over the semiconductor package device 1 shown in FIG. 1, in some cases. As shown in FIG. 1, the inner terminal 14a of the coil 14 of the semiconductor package device 1 is disposed closer to a connection contact of the electronic component 11a than is the outer terminal 14b of the coil 14 (e.g. is substantially adjacent to the connection contact of the electronic component 11a). The conductive path between the outer terminal 14b of the coil 14 and the electronic component 11a is relatively longer than is the conductive path between the outer terminal 14a of the coil 14 and the electronic component 11a. In order to avoid the conductive path being short circuited (e.g. via other conductive lines), an additional insulation layer can be included which separates the conductive path from other conductive lines of the carrier 13. For example, the carrier 13 can include at least three layers: a first layer for accommodating the coil 14, a second layer for accommodating the magnetically permeable component 15 and a third layer for accommodating the conductive path (e.g., the conductive line 14w). The addition of the insulating layer might increase the total thickness of the semiconductor package device 1 and the manufacturing cost.

As for the semiconductor package device 2A shown in FIG. 2A, by using the MIM capacitor to form a conductive path between the inner terminal 27a of the coil 27 and electronic component 21b, protection from short circuits and other undesirable electrical interference may be achieved without including an additional insulation layer. Therefore, the total size of the semiconductor package device 2A and the manufacturing cost can be reduced. Moreover, in comparison with some wireless charging modules, the distance between the magnetic resonance wireless charging module (e.g. the core module 200) and an electronic device to be charged (e.g. the electronic component 21b) can be increased, but charging efficiency may remain the same or even improve.

Figure 2B:
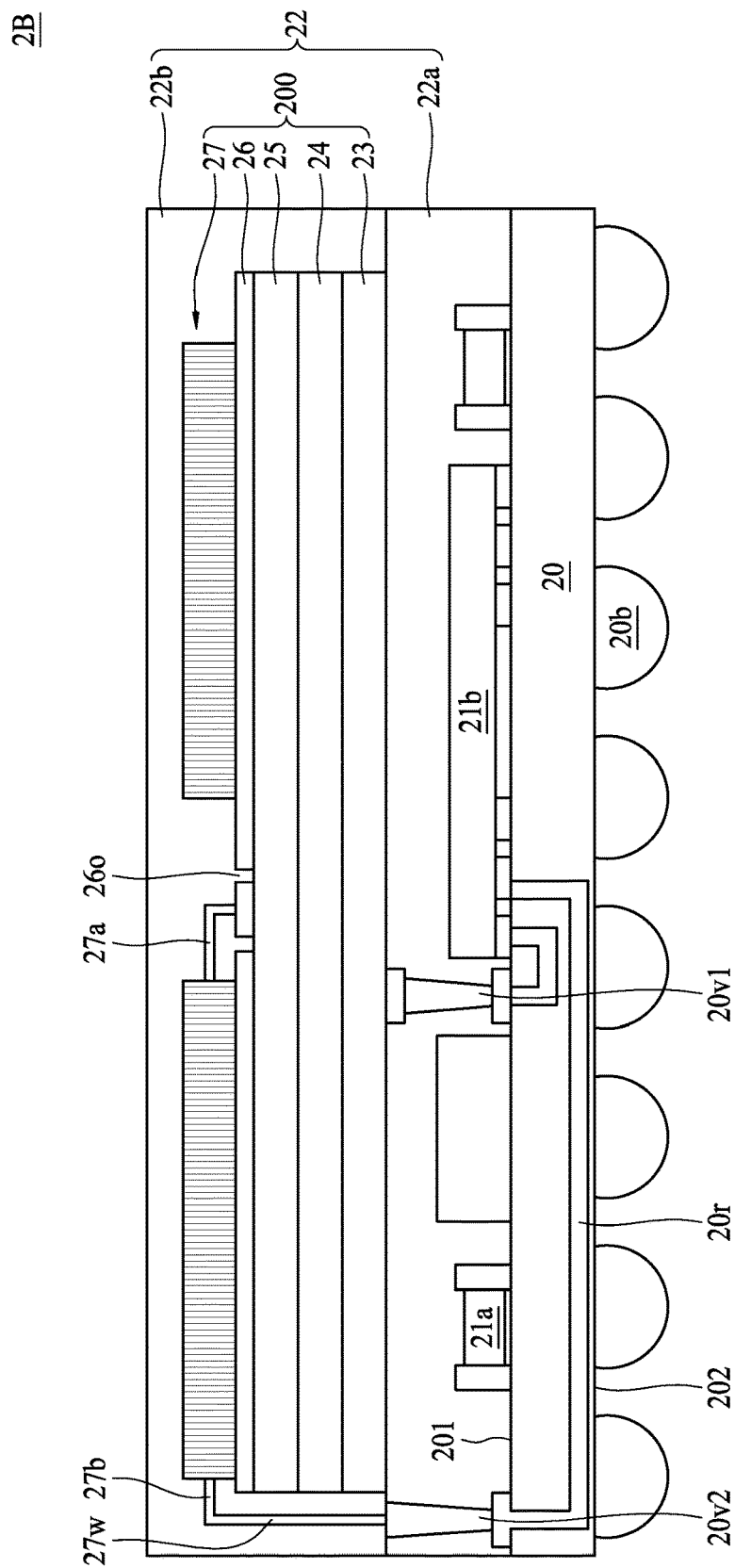
FIG. 2B illustrates a cross-sectional view of a semiconductor package device in accordance with some embodiments of the present disclosure.

FIG. 2B illustrates a cross-sectional view of a semiconductor package device 2B in accordance with some embodiments of the present disclosure. The semiconductor package device 2B is similar to the semiconductor package device 2A in FIG. 2A, except that in FIG. 2B, the electrical connection 20v1 is disposed closer to the electronic component 21b (e.g. is substantially adjacent to the electronic component 21b). For example, in comparison with the electrical connection 20v1 in FIG. 2A, the electrical connection 20v1 in FIG. 2B is disposed closer to the center of the coil 27. Thus a conductive path (e.g. of the interconnection structure 20r) between the electrical connection 20v1 and the electronic component 21b can be shorter, which can reduce the manufacturing cost and increase the space available for electrical connections within the substrate 20.

Figure 3:
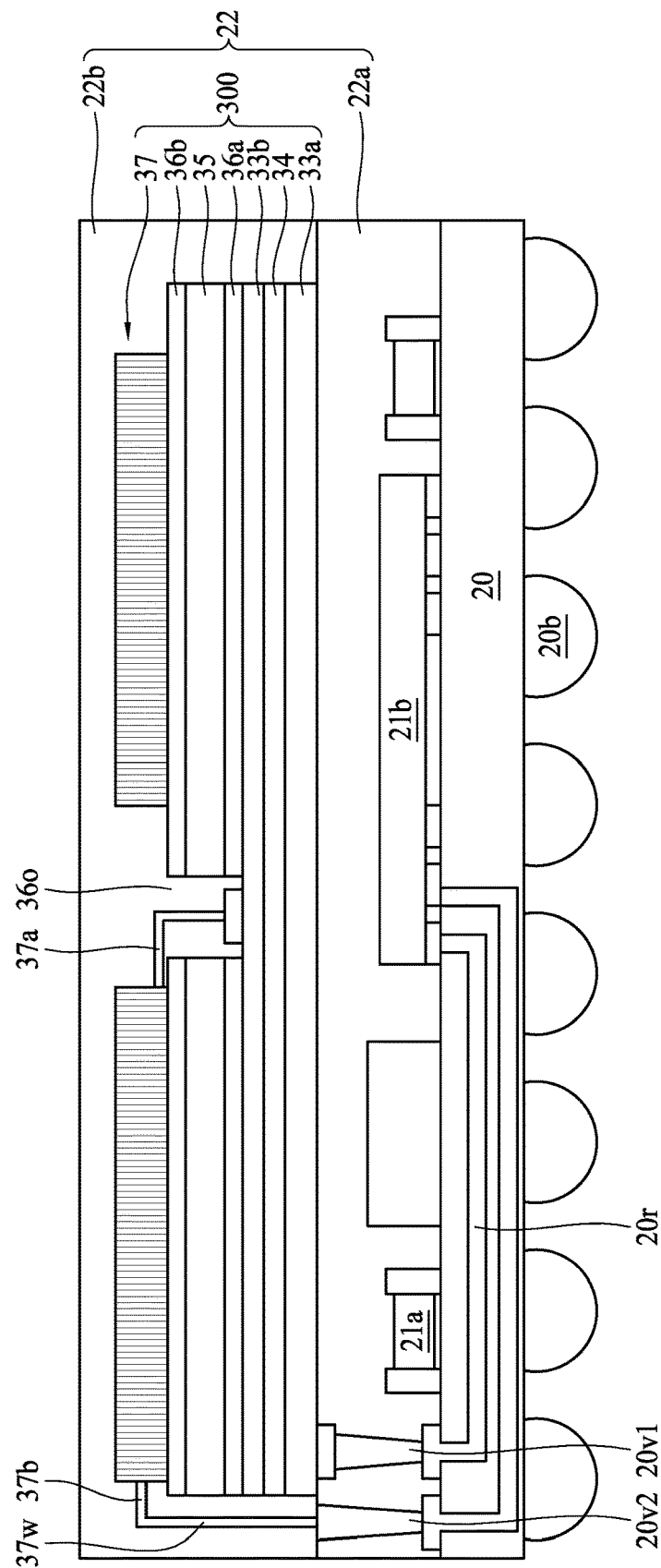
FIG. 3 illustrates a cross-sectional view of a semiconductor package device in accordance with some embodiments of the present disclosure.

FIG. 3 illustrates a cross-sectional view of a semiconductor package device 3 in accordance with some embodiments of the present disclosure. The semiconductor package device 3 is similar to the semiconductor package device 2A in FIG. 2A, except that the coil module 300 of the semiconductor package device 3 is different from the coil module 200 of the semiconductor package device 2A.

The coil module 300 is disposed on the first portion 22a of the package body 22. The coil module 300 includes a first conductive layer 33a, a dielectric layer 34, a second conductive layer 33b, a first insulating layer 36a, a magnetic layer 35, a second insulating lay 36b and a coil 37.

The first conductive layer 33a is disposed on the first portion 22a of the package body 22. The conductive layer 33a contacts a portion of an electrical connection 20v1 that is exposed from the first portion 22a of the package body 22. In some embodiments, the first conductive layer 33a is a non-magnetic (or weakly magnetic) conductive layer. The first conductive layer 33a includes a material with a high conductivity. For example, the first conductive layer 33a includes any of Ag, Cu, Al, Au, or an alloy thereof.

The dielectric layer 34 is disposed on the first conductive layer 33a. The dielectric layer may be molding compounds, pre-impregnated composite fibers (e.g., pre-preg) BPSG, silicon oxide, silicon nitride, silicon oxynitride, USG, any combination thereof, or the like. Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The second conductive layer 33b is disposed on the dielectric layer 34. In some embodiment, the second conductive layer 33b is a non-magnetic (or weakly magnetic) conductive layer. The second conductive layer 33b includes a material with a high conductivity. For example, the second conductive layer 33b includes any of Ag, Cu, Al, Au, or an alloy thereof.

The first insulating layer 36a is disposed on the second conductive layer 33b. The first insulating layer 36a is insulating, and can be magnetic or non-magnetic. The first insulating layer 36a can include, for example, ferromagnetic materials such as barium ferrate or strontium ferrite. The first insulating layer 36a can include an oxidized form of metals or non-metals such as $SiO_2$ or $Al_2O_3$.

The magnetic layer 35 is disposed on the first insluting layer 36a. The magnetic layer 35 includes a material with a high permeability and low magnetic saturation. In some embodiments, the magnetic layer 35 forms a loop and/or is substantially annulus shaped and/or is substantially coil shaped, and defines a space between portions of the magnetically permeable component 15 (which may correspond to, for example, an inner diameter of the magnetically permeable component 15). The magnetic layer 35 can include, for example, Ferrite, such as, but not limited to, $Fe_2O_3$, zinc ferrite $ZnFe_2O_4$, manganese-zinc ferrite $Mn_aZn_{(1-a)}Fe_2O_4$ or nickel-zinc ferrite $Ni_aZn_{(1-a)}Fe_2O_4$, Ferroalloy, such as, but not limited to, ferrosilicon FeSi, ferro silicon manganese FeSiMg, iron phosphide FeP or iron-nickel FeNi, magnetic adhesive or other magnetically permeable metal or metal alloy (e.g., another nickel-containing or iron-containing material), or a combination thereof. One measure of magnetic permeability of a material is in terms of its relative permeability with respect to a permeability of free space. Examples of suitable magnetically permeable materials for the magnetic layer 35 include those having a relative permeability greater than about 1, such as at least about 2, at least about 5, at least about 10, at least about 50, at least about 100, at least about 500, at least about 1000, at least about 5000, at least about $10^4$, at least about $10^5$, or at least about $10^6$. Magnetic permeability of a material can be measured in standardized conditions, such as at room temperature and at a particular field strength, such as at about 0.5 Tesla or at about 0.002 Tesla. In some embodiments, the permeability of the magnetic layer 35 is in a range from about 500 H/m to about 3000 H/m The second insulating layer 36b is disposed on the magnetic layer 35. The second insulating layer 36b is insulating, and can be magnetic or non-magnetic. The insulating layers 36a and 36b and the magnetic layer 35 together define an opening 36o. The second insulating layer 36b can include, for example, ferromagnetic materials such as barium ferrate or strontium ferrite. The second insulating layer 36b can include an oxidized form of metals or non-metals such as $SiO_2$ or $Al_2O_3$.

The coil 37 is disposed on the second insulating layer 36b. In some embodiments, an inner diameter of the coil 37 is greater than an inner diameter of the magnetic layer 35 (e.g. the inner diameter of the coil 37 is greater than a width of the opening 36O), and an outer diameter of the coil 37 is less than an outer diameter of the magnetic layer 35. For example, a projection of the coil 37 on the first portion 22a of the package body 22 (e.g., a vertical projection extending from the coil 37 to the first portion 22a of the package body 22) is completely covered by a projection of the magnetic layer 35 on the first portion 22a of the package body 22 (e.g., a vertical projection extending from the magnetic layer 35 to the first portion 22a of the package body 22). For example, as shown in FIG. 3, a total horizontal extension of the magnetic layer 35 is greater than a total horizontal extension of the coil 37.

In some embodiments, the coil 37 includes two terminals 37a, 37b. The terminal 37a (which can be also referred to as the "inner terminal") is closer to the center of the coil 37 (e.g. is substantially at or near the center) than is the terminal 37b (which can be also referred to as the "outer terminal"), which is disposed at a peripheral edge of the coil 37. The terminal 37a of the coil 37 electrically connects to the second conductive layer 33b through the opening 36o defined by the first insulating layer 36a, the magnetic layer 35 and the second insulating layer 36b. The terminal 37b of the coil 37 electrically connects to an electrical connection 20v2 (e.g., a through via) within the first portion 22a of the package body 22 by a conductive line 37w (or conductive paste) disposed along a peripheral edge of the first/second insulating layers 36a, 36b, the magnetic layer 35, the dielectric layer 34 and the first/second conductive layers 33a, 33b. In the case of using conductive paste to connect the terminal 37b and the electrical connection 20v2, an insulating component (e.g., an underfill) can be disposed between the conductive paste and the first/second insulating layers 36a, 36b, the magnetic layer 35, the dielectric layer 34 and the first/second conductive layers 33a, 33b. The coil 37 can be magnetically coupled to a magnetic field to induce a current within the coil 37. In some embodiments, the induced current is provided to the electronic components 21a, 21b through electrical connections 20v1, 20v2 and the interconnection structure 20r within the substrate 20, so as to power the electronic components 21a, 21b or other electronic components external to the semiconductor package device 2A. Thus, the coil 37 can function as a wireless receiver (e.g., a charging coil). The coil 37 includes a conductive material such as a metal or metal alloy. Examples include Au, Ag, Al, Cu, or an alloy thereof.

In some embodiments, the first conductive layer 33a, the dielectric layer 34 and the second conductive layer 33b defines a MIM capacitor, in which the first conductive layer 33a is one terminal of the MIM capacitor and the second conductive layer 33b is another terminal of the MIM capacitor. The induced current of the coil 37 is transmitted from the second conductive layer 33b to the first conductive layer 33a by capacitance coupling. Thus, the coil module 300 of semiconductor package device 3 can function as a magnetic resonance charging module.

By way of comparison with the semiconductor package device 2A, as shown in FIG. 2A, since the magnetic layer 25 can function as a terminal of the MIM capacitor, the magnetic layer 25 can be made of low-resistance materials. However, heat may be readily generated in low-resistance materials when current is induced in low-resistance materials by a magnetic field. Therefore, the configuration of the semiconductor package 3 may be used, for example, in high power device to prevent generating too much heat (although the semiconductor package 3 may be used in low power devices as well). As shown in FIG. 3, two terminals of the MIM capacitor are respectively formed by the first conductive layer 33a and 33b, and the magnetic layer 35 covers most of the second conductive layer 33b, thus helping block any magnetic field, so as to prevent the current from being induced on the second conductive layer 33b by the magnetic field. The coil module 300 shown in FIG. 3 can be applied to both low-power and high-power devices.

Figure 4A:
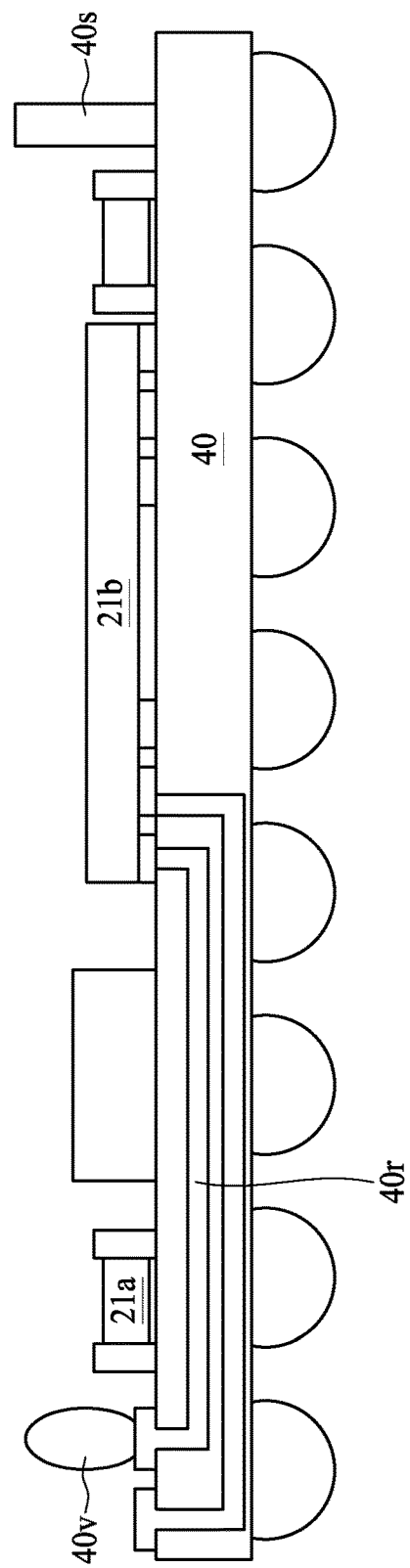
FIG. 4A, FIG. 4B and FIG. 4C illustrate a semiconductor manufacturing method in accordance with some embodiments of the present disclosure.
Figure 4B:
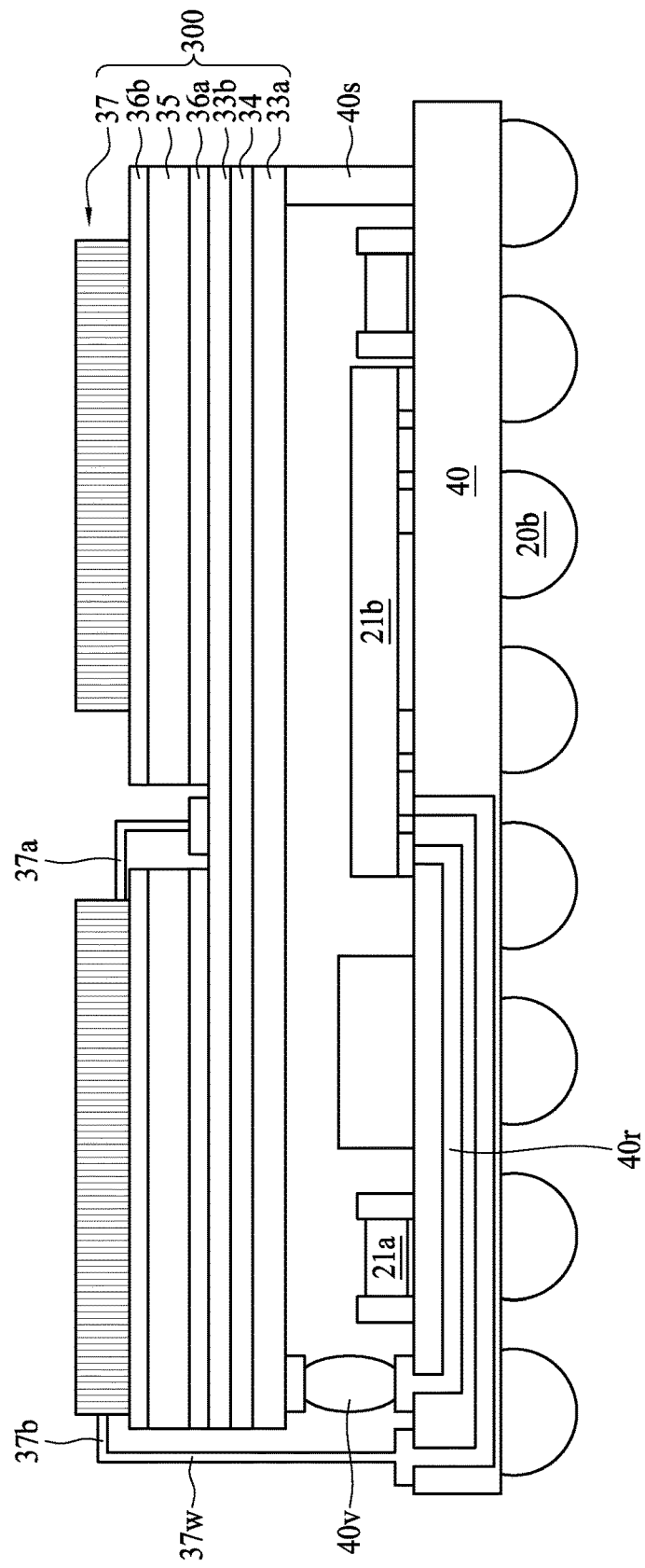
Figure 4C:
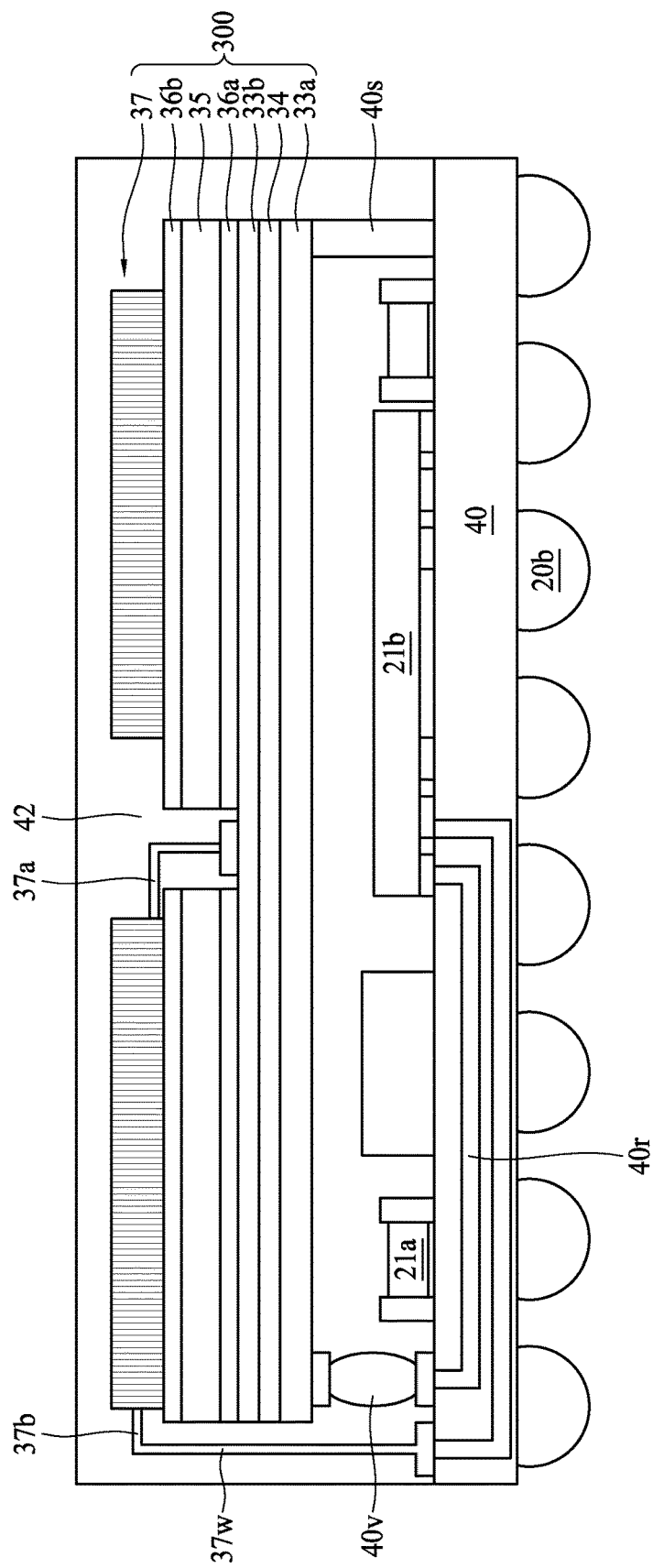

FIGS. 4A, 4B and 4C illustrate a semiconductor manufacturing method in accordance with some embodiments of the present disclosure.

Referring to FIG. 4A, a substrate 40 is provided. The substrate 40 may include, for example, a printed circuit board, such as a paper-based copper foil laminate, a composite copper foil laminate, or a polymer-impregnated glass-fiber-based copper foil laminate. The substrate 40 may include an interconnection structure 40r, such as a RDL or a grounding component.

Electronic components 21a, 21b are disposed on the substrate 40. The electronic component 21a may include a passive electronic component, such as a capacitor, a resistor or an inductor. The electronic component 21b may include an active electronic component, such as an integrated circuit (IC) chip or a die. The electronic components 21a, 21b may be connected to the substrate 40 by flip-chip or wire-bond techniques.

An electrical connection 40v is formed on a conductive pad of the substrate 40 that electrically connects to the electronic component 21b through the interconnection structure 40r. In some embodiments, the electrical connection 40v is a solder ball or a copper pillar.

One or more holding structures 40s are formed on the substrate 40. In some embodiments, the holding structures 40s are made of non-conductive materials, such as a spacer. In some embodiments, the number and the location of the holding structures 40s are sufficient to support a coil module which is added to the semiconductor package device in subsequent processes. For example, one holding structure is formed at a corner of the substrate 40 and another holding structure is formed at an opposite corner of the substrate 40. In some embodiments, the holding structures 40s are not used, and the electrical connection 40v supports the coil module.

Referring to FIG. 4B, the coil module 300 as shown in FIG. 3 is formed on the electrical connection 40v and the holding structures 40s. The conductive pad of the coil module 300 contacts the electrical connection 40v. In other embodiments, the coil module 300 can be the coil module 200 shown in FIG. 2A or other coil modules depending on design specifications.

In some embodiments, the coil module 300 may be formed by the following steps: (i) forming a MIM capacitor including the first conductive layer 33a, the dielectric layer 34 and the second conductive layer 33b; (ii) forming the first insulating layer 36a, the magnetic layer 35 and the second insulating layer 36b on the MIM capacitor; (iii) forming the coil 37 on the second insulating layer 36b; (iv) forming an opening 36o to expose a portion of the second conductive layer 33b; (v) connecting one terminal 37a of the coil 37 with a conductive pad on the second conductive layer 33b; and (vi) connecting another terminal 37b of the coil with a conductive pad on the substrate 40 that is connected to the electronic component 21b through the interconnection structure 40r within the substrate 40. In some embodiments, in operation (iv), the opening 36o can be formed by drilling, laser drilling or etching. In some embodiments, in operations (v) and (vi), the connection can be achieved by wire bonding or conductive paste techniques.

Referring to FIG. 4C, a package body 42 is formed to cover or encapsulate the electronic components 21a, 21b and the coil module 300. In some embodiments, the encapsulant can include, for example, a Novolac-based resin, an epoxy-based resin, a silicone-based resin, or another suitable material. In one or more embodiments, the encapsulant can be applied using any of a number of molding techniques, such as compression molding, injection molding, or transfer molding.

FIGS. 5A, 5B, 5C, 5D and 5E illustrate a semiconductor manufacturing method in accordance with some embodiments of the present disclosure.

Figure 5A:
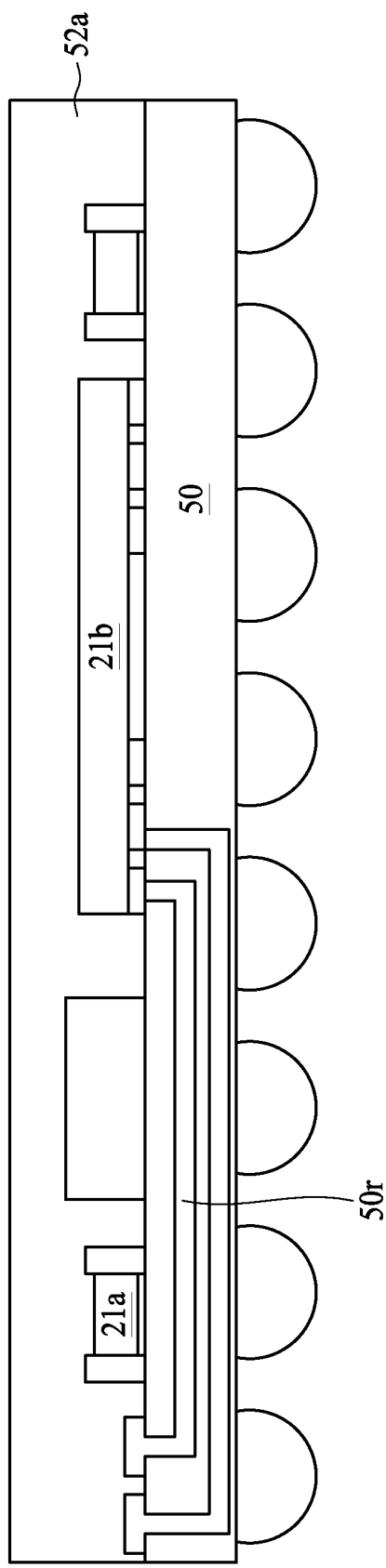
FIG. 5A, FIG. 5B, FIG. 5C, FIG. 5D and FIG. 5E illustrate a semiconductor manufacturing method in accordance with some embodiments of the present disclosure.

Referring to FIG. 5A, a substrate 50 is provided. The substrate 50 may include, for example, a printed circuit board, such as a paper-based copper foil laminate, a composite copper foil laminate, or a polymer-impregnated glass-fiber-based copper foil laminate. The substrate 50 may include an interconnection structure 50r, such as a RDL or a grounding component.

Electronic components 21a, 21b are disposed on the substrate 50. The electronic component 21a may include a passive electronic component, such as a capacitor, a resistor or an inductor. The electronic component 21b may include an active electronic component, such as an IC chip or a die. The electronic components 21a, 21b may be connected to the substrate 50 by flip-chip or wire-bond techniques.

A package body 52a is then formed to cover or encapsulate the electronic components 21a, 21b. In some embodiments, the encapsulant can include, for example, a Novolac-based resin, an epoxy-based resin, a silicone-based resin, or another suitable material. In one or more embodiments, the encapsulant can be applied using any of a number of molding techniques, such as compression molding, injection molding, or transfer molding.

Figure 5B:
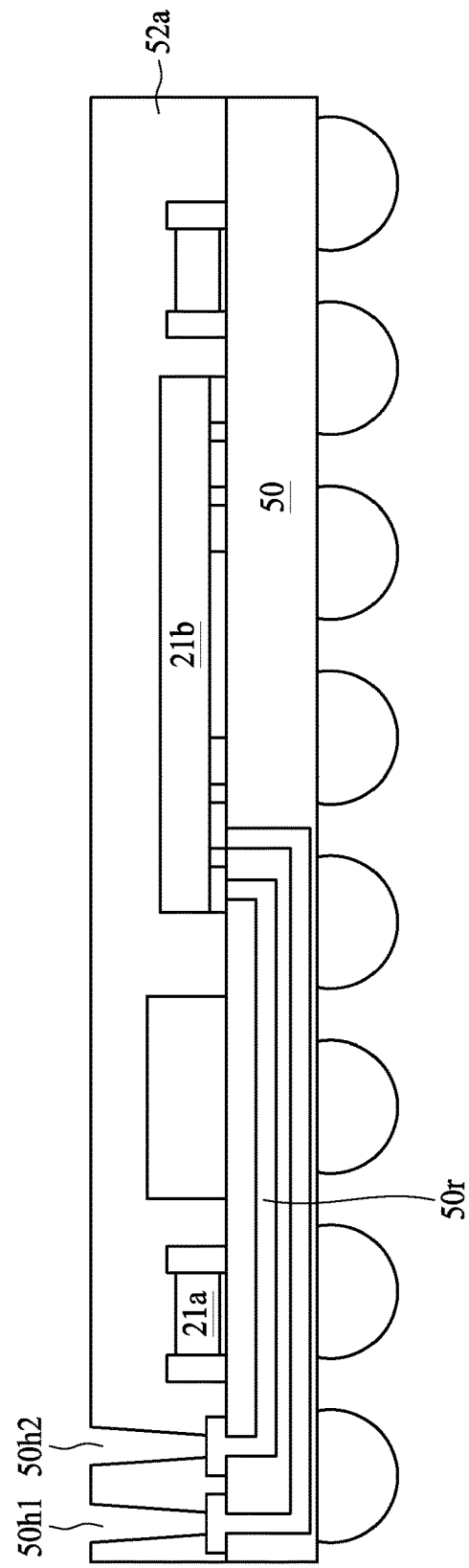

Referring FIG. 5B, holes 52h1 and 52h2 defined by the package body 52a are formed to penetrate the package body 52a to expose conductive pads on the substrate 50 that electrically connect with the electronic component 21b through the interconnection structure 50r. In some embodiments, the holes 52h1 and 52h2 can be formed by drilling, laser drilling or etching.

Figure 5C:
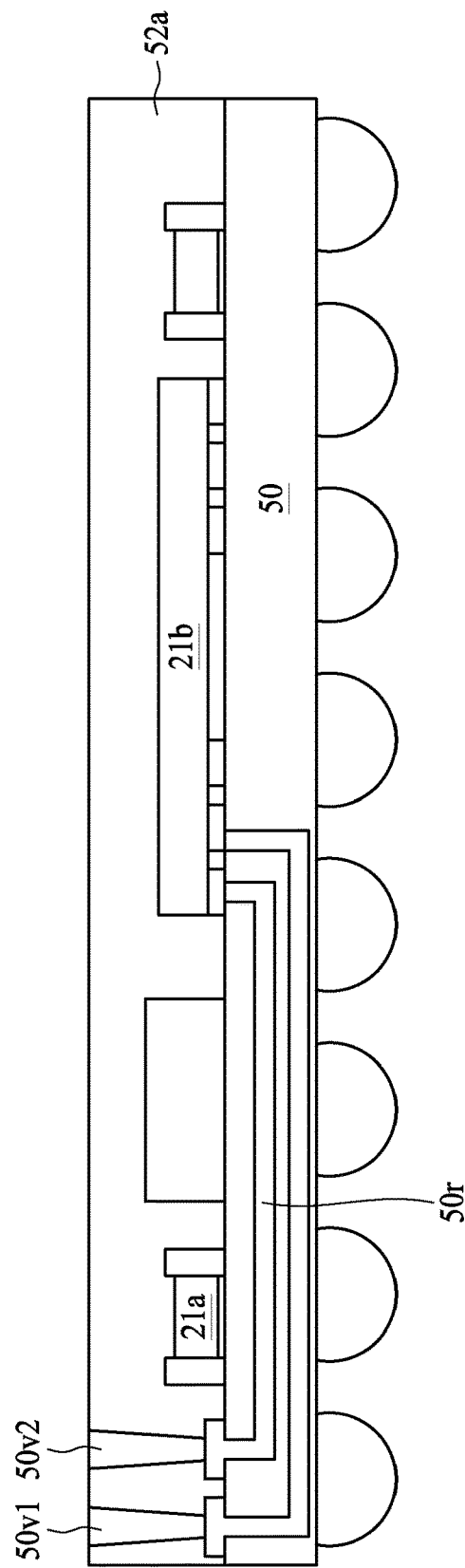

Referring FIG. 5C, the holes 52h1 and 52h2 are filled with conductive materials to form electrical connections 50v1 and 50v2. The electrical connections 50v1 and 50v2 contact conductive pads on the substrate 50 that are exposed from the package body 52a. The electrical connections 50v1 and 50v2 include a material with a high conductivity. For example, the electrical connections 50v1 and 50v2 include any of Ag, Cu, Al, Au, or an alloy thereof.

Figure 5D:
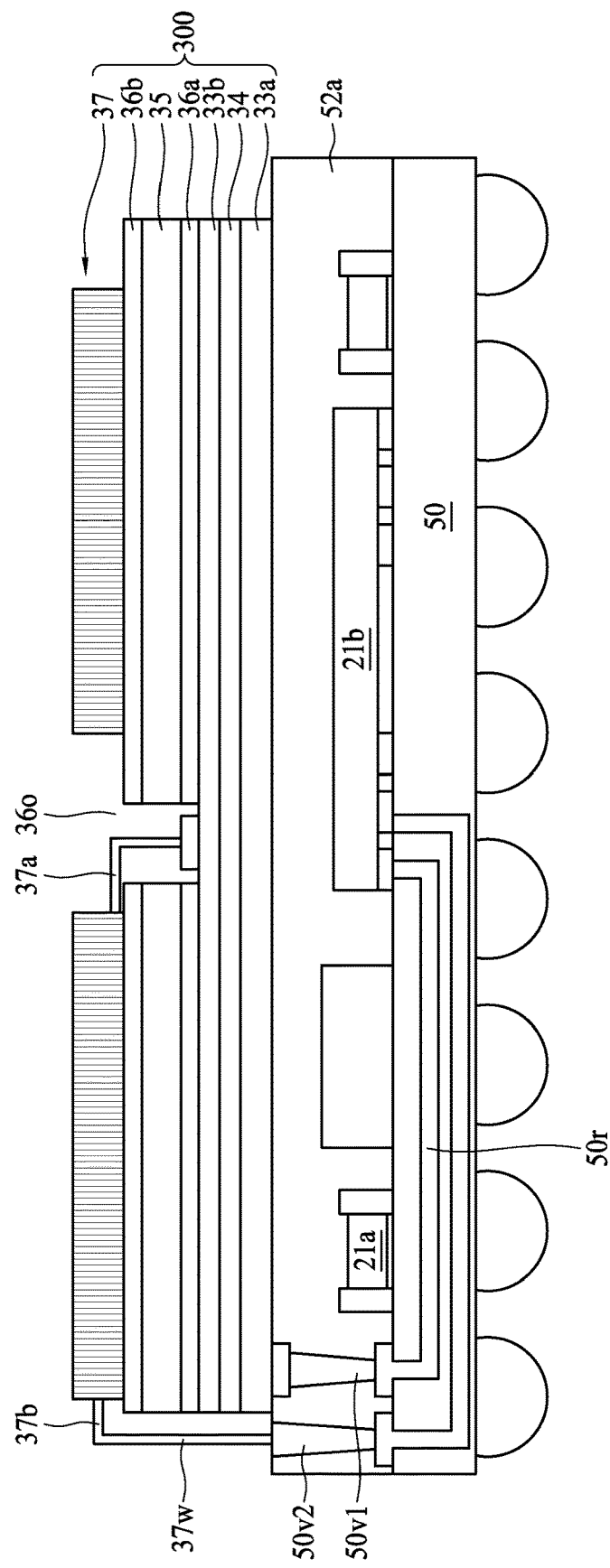

Referring FIG. 5D, the coil module 300 as shown in FIG. 3 is formed on the package body 52a. A conductive pad of the coil module 300 contacts the electrical connection 50v1. One terminal 37b of the coil 37 of the coil module 300 electrically connects to the electrical connection 50v2 through a conductive wire 37w (or conductive paste). In some embodiments, the connection can be achieved by wire bonding or conductive paste techniques. In other embodiments, the coil module 300 can be the coil module 200 shown in FIG. 2A or other coil modules depending on design specifications. The operations of forming the coil module 300 are similar to the operations shown in FIG. 4B. Alternatively, the coil module 300 can be formed by other suitable processes.

Figure 5E:
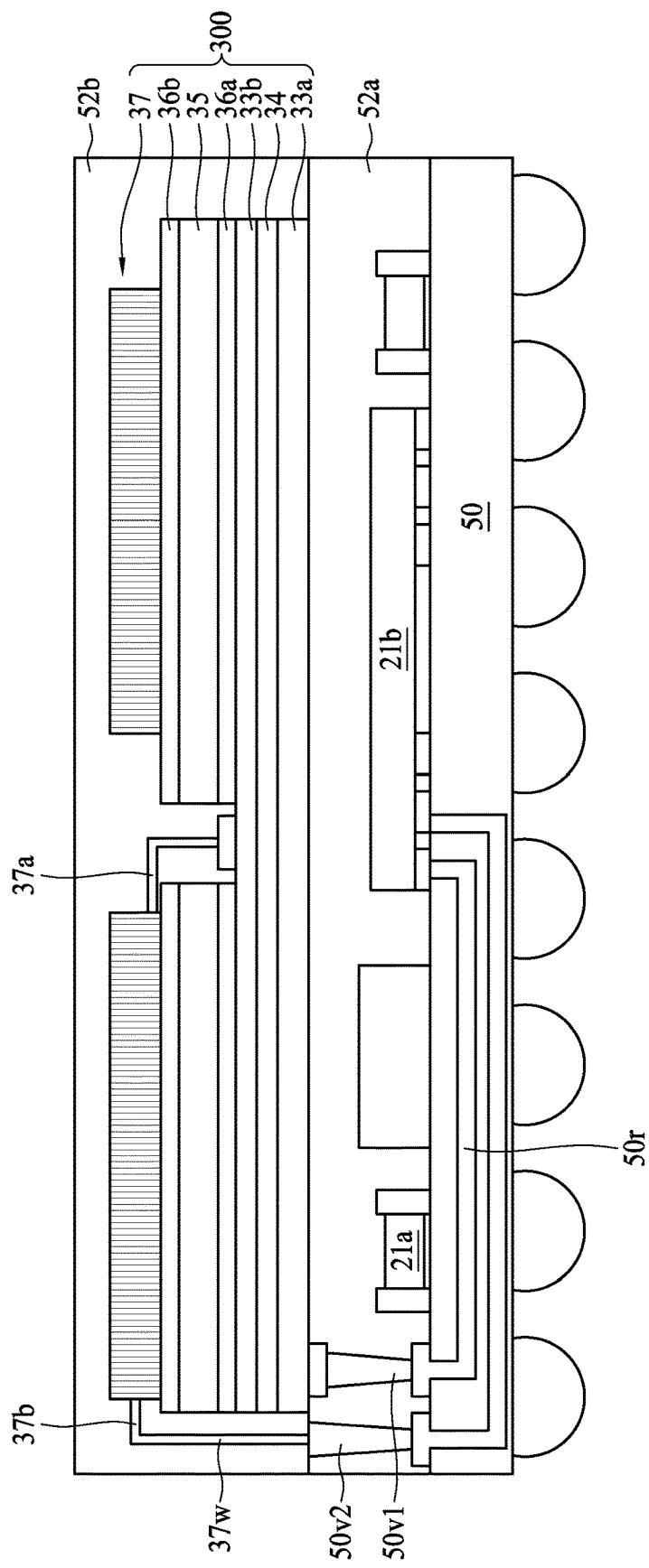

Referring to FIG. 5E, a package body 52b is formed to cover or encapsulate the coil module 300. In some embodiments, the encapsulant can include, for example, a Novolac-based resin, an epoxy-based resin, a silicone-based resin, or another suitable material. In one or more embodiments, the encapsulant can be applied using any of a number of molding techniques, such as compression molding, injection molding, or transfer molding. In some embodiments, the package body 52b is the same as the package body 52a. Alternatively, the package body 52b and the package body 52a are formed of different materials.

Figure 6A:
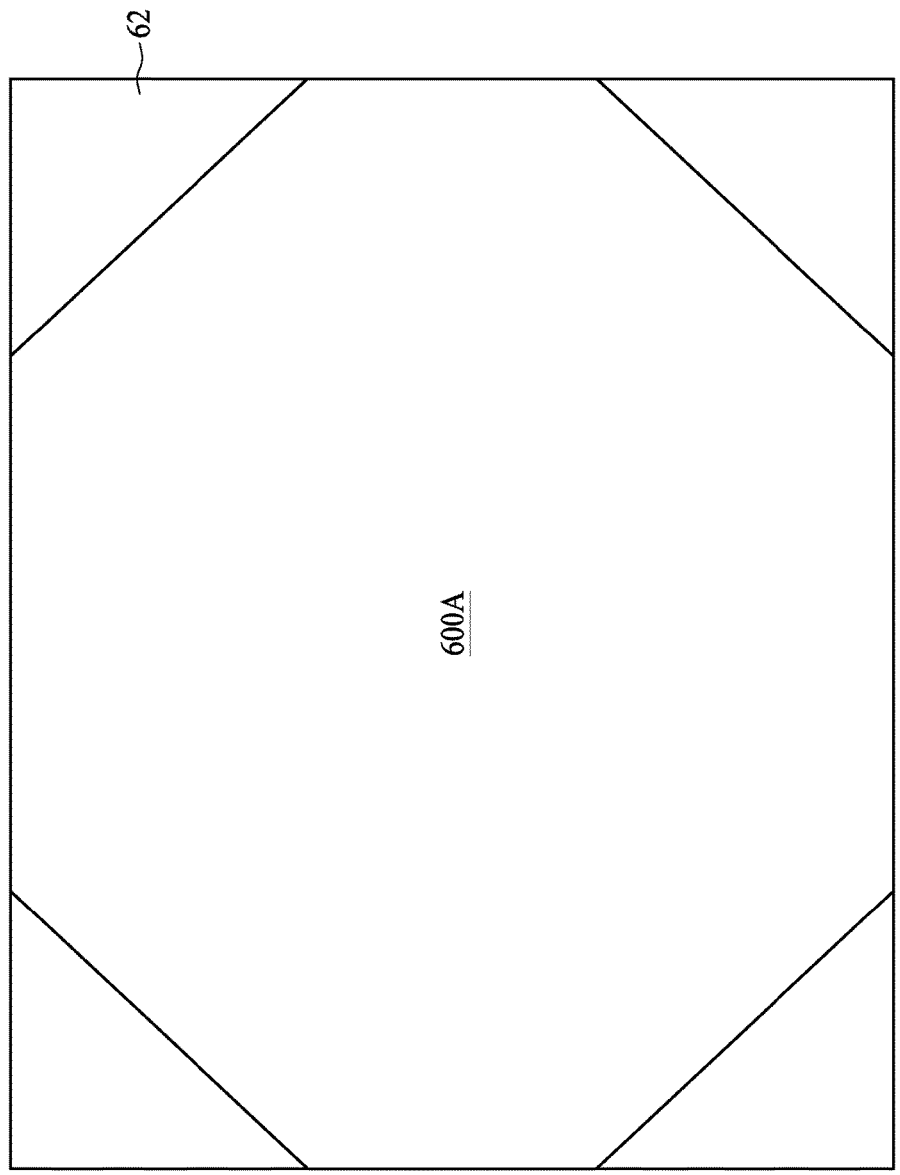
FIG. 6A illustrates a top view of a semiconductor package device in accordance with some embodiments of the present disclosure.

FIG. 6A illustrates a top view of a semiconductor package device 6A in accordance with some embodiments of the present disclosure. The semiconductor package device 6A includes a package body 62 and a coil module 600A. The semiconductor package device 6A may be any of the semiconductor package devices 2A, 2B and 3 shown in FIGS. 2A, 2B and 3, and the coil module 600A may be any of the coil modules 200 and 300 shown in FIGS. 2A, 2B and 3.

As shown in FIG. 6A, the coil module 600A is substantially hexagonal from a top view, and at least one edge of the coil module 600A is encapsulated by the package body 62, which can help to increase an adhesion between the coil module 600A and the package body 62.

Figure 6B:
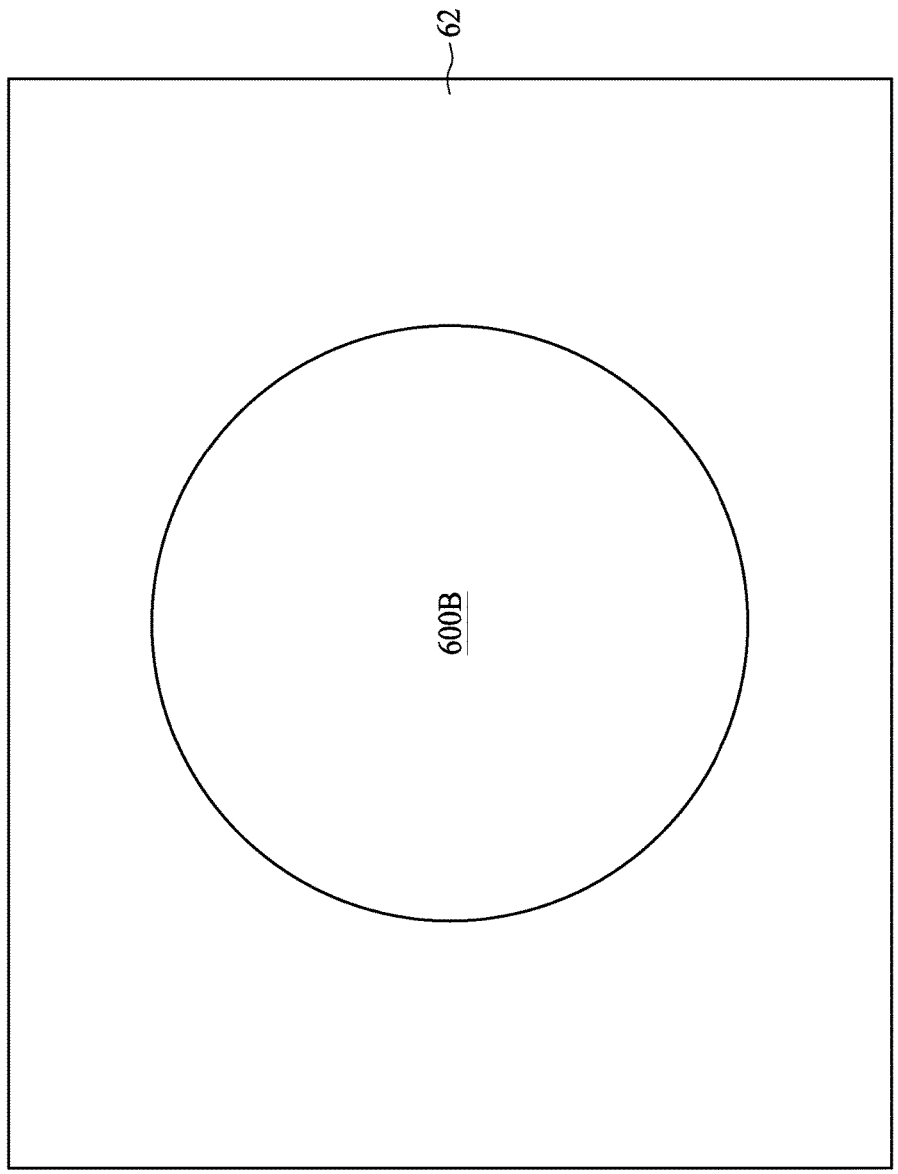
FIG. 6B illustrates a top view of a semiconductor package device in accordance with some embodiments of the present disclosure.

FIG. 6B illustrates a top view of a semiconductor package device 6B in accordance with some embodiments of the present disclosure. The semiconductor package device 6B is similar to the semiconductor 6A in FIG. 6A except that the coil module 600B is substantially ovular or substantially circular from a top view and is completely encapsulated by the package body 62.

Figure 6C:
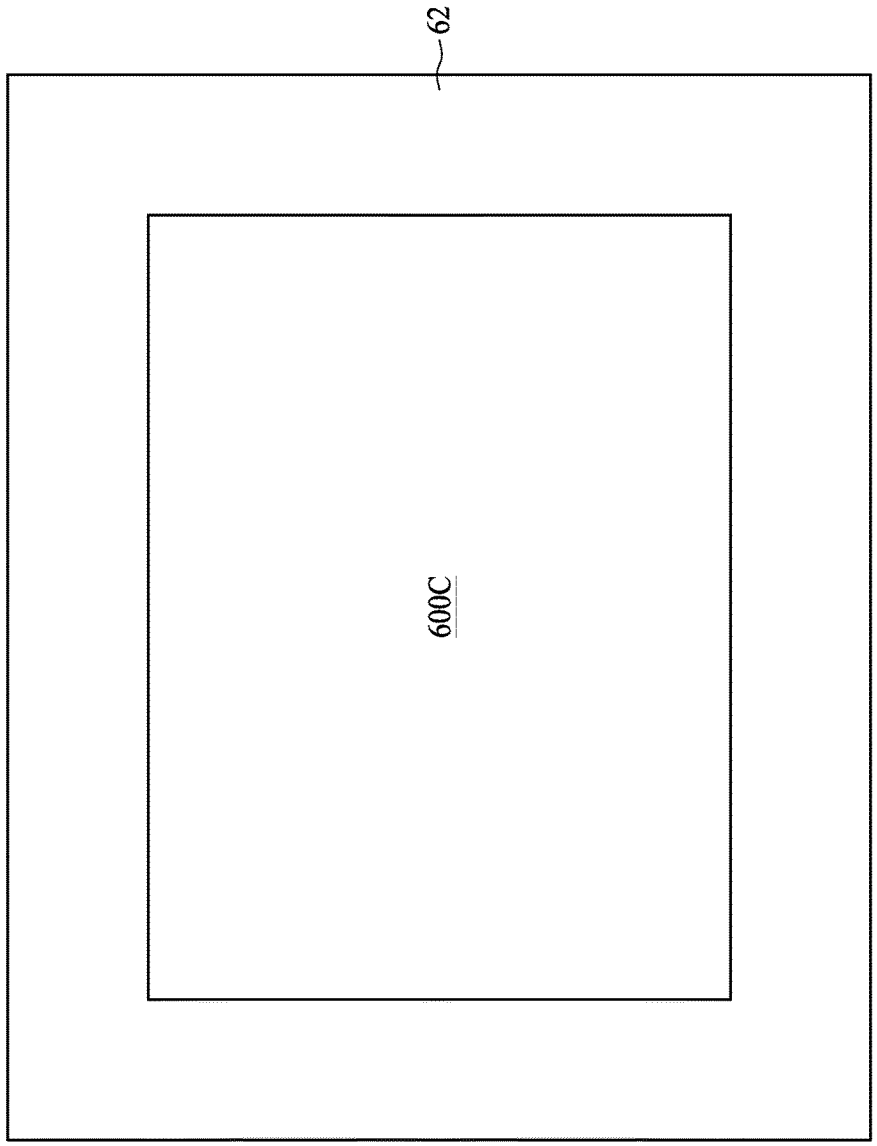
FIG. 6C illustrates a top view of a semiconductor package device in accordance with some embodiments of the present disclosure.

FIG. 6C illustrates a top view of a semiconductor package device 6C in accordance with some embodiments of the present disclosure. The semiconductor package device 6C is similar to the semiconductor 6A in FIG. 6A except that the coil module 600C is substantially rectangular or substantially square from a top view and is completely encapsulated by the package body 62. In some embodiments, the coil module can be any shape depending on design specifications.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers (μm) of lying along a same plane, such as within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on", "over", or "above" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
a substrate;
a package body disposed on the substrate, the package body having a first part and a second part disposed above the first part;
a conductive layer disposed on the first part of the package body and electrically connected to the substrate;
a dielectric layer disposed on the conductive layer;
a magnetic layer disposed on the dielectric layer;
a first insulating layer disposed on the magnetic layer; and
a coil disposed on the first insulating layer, wherein the coil has a first terminal electrically connected with the magnetic layer.

2. The semiconductor package device of claim 1, wherein the coil further comprises a second terminal electrically connected with the substrate through a first conductive component, and wherein the first conductive component is spaced apart from the magnetic layer, the dielectric layer and the conductive layer.

3. The semiconductor package device of claim 2, wherein the conductive layer is electrically connected with the substrate through a second conductive component within the first part of the package body, the first conductive component is disposed in the second part of the package body, and the second terminal of the coil is electrically connected with the substrate via the first conductive component and a third conductive component within the first part of the package body.

4. The semiconductor package device of claim 1, further comprising an electronic component disposed on the substrate and encapsulated by the first part of the package body.

5. The semiconductor package device of claim 4, wherein the coil, the magnetic layer, the dielectric layer and the conductive layer are above the electronic component and are encapsulated by the second part of the package body.

6. The semiconductor package device of claim 1, wherein a portion of the magnetic layer is exposed from the first insulating layer, and the first terminal of the coil is electrically connected with the exposed portion of the magnetic layer.

7. The semiconductor package device of claim 1, wherein the first part of the package body and the second part of the package body are formed in a single process.

8. The semiconductor package device of claim 1, wherein the first terminal of the coil and the conductive layer are capacitively coupled.

9. A semiconductor package device, comprising:
a substrate;
a package body disposed on the substrate, the package body having a first part and a second part above the first part;
a first conductive layer disposed on the first part of the package body and electrically connected to the substrate;
a dielectric layer disposed on the first conductive layer;
a second conductive layer disposed on the dielectric layer;
a magnetic layer is disposed over the second conductive layer; and
a coil disposed over the magnetic layer, wherein the coil has a first terminal electrically connected with the second conductive layer.

10. The semiconductor package device of claim 9, wherein the coil further comprises a second terminal electrically connected with the substrate through a first conductive component, and wherein the first conductive component is spaced apart from the magnetic layer, the dielectric layer, the first conductive layer and the second conductive layer.

11. The semiconductor package device of claim 10, wherein the first conductive layer is electrically connected with the substrate through a second conductive component within the first part of the package body, the first conductive component is disposed in the second part of the package body, and the second terminal of the coil is electrically connected with the substrate via the first conductive component and a third conductive component within the first part of the package body.

12. The semiconductor package device of claim 9, further comprising:
a first insulating layer between the magnetic layer and the second conductive layer; and
a second insulating layer between the magnetic layer and the coil.

13. The semiconductor package device of claim 9, further comprising an electronic component disposed on the substrate and encapsulated by the first part of the package body.

14. The semiconductor package device of claim 13, wherein the coil, the magnetic layer, the dielectric layer, the first conductive layer and the second conductive layer are above the electronic component and are encapsulated by the second part of the package body.

15. The semiconductor package device of claim 9, wherein a portion of the second conductive layer is exposed from the magnetic layer, and the first terminal of the coil is electrically connected with the exposed portion of the second conductive layer.

16. The semiconductor package device of claim 9, wherein the first part of the package body and the second part of the package body are formed in a single process.

17. The semiconductor package device of claim 9, wherein the first terminal of the coil and the conductive layer are capacitively coupled.

18. A magnetic resonance wireless charging module, comprising:
a substrate;
a metal-insulator-metal (MIM) capacitor disposed over the substrate, the MIM capacitor including a first terminal electrically connected with the substrate;
a magnetic layer disposed on the MIM capacitor; and
a coil disposed over the magnetic layer, wherein the coil has a first terminal electrically connected with a second terminal of the MIM capacitor.

19. The magnetic resonance wireless charging module of claim 18, wherein the coil further comprises a second terminal electrically connected with the substrate through a conductive component, and wherein the conductive component is spaced apart from the MIM capacitor and the magnetic layer.

20. The magnetic resonance wireless charging module of claim 18, further comprising an electronic component disposed on the substrate.

21. The magnetic resonance wireless charging module of claim 20, further comprising a package body encapsulating the electronic component, the MIM capacitor, the magnetic layer and the coil.

22. The magnetic resonance wireless charging module of claim 21, further comprising at least one spacer disposed on the substrate and separating the MIM capacitor from the substrate, wherein the at least one spacer is encapsulated by the package body.

23. The magnetic resonance wireless charging module of claim 18, wherein the magnetic layer defines an opening that exposes a portion of the second terminal of the MIM capacitor, and the first terminal of the coil is electrically connected with the exposed portion of the second terminal of the MIM capacitor.

* * * * *